United States Patent

Eastty et al.

[11] Patent Number: 6,078,621
[45] Date of Patent: Jun. 20, 2000

[54] SIGNAL PROCESSORS

[76] Inventors: Peter Charles Eastty, 18 Fairacres Road, Oxford, OX4 1TE; Christopher Sleight, 8 West Street, Chipping Norton,Oxon, OX7 5AA; Peter Damien Thorpe, 21 Hodges Court, Oxford, Oxon, OX1 5NY, all of United Kingdom

[21] Appl. No.: 08/978,844

[22] Filed: Nov. 26, 1997

[30] Foreign Application Priority Data

Nov. 27, 1996 [GB] United Kingdom .................. 9624671

[51] Int. Cl.[7] .................................................. H04B 14/06
[52] U.S. Cl. ............................................ 375/247; 341/143
[58] Field of Search .................................. 375/247, 248; 341/143, 126

[56] References Cited

U.S. PATENT DOCUMENTS

| | | | |
|---|---|---|---|
| 4,920,544 | 4/1990 | Endo et al. | 375/26 |
| 5,079,551 | 1/1992 | Kimura et al. | 341/143 |
| 5,311,181 | 5/1994 | Ferguson, Jr. et al. | 341/143 |
| 5,414,424 | 5/1995 | Cabler | 341/143 |

OTHER PUBLICATIONS

Kershaw S M et al: "Sigma–Delta Modulation for Audio DSP" IEE Colloquium on Audio DSP Circuits and Systems, Nov. 16, 1993, XP000573329.

*Primary Examiner*—Stephen Chin
*Assistant Examiner*—Mohammad Ghayour

[57] ABSTRACT

A signal processor for 1-bit signals comprises a nth order Delta-Sigma Modulator, where n is greater than or equal to 2. The Delta-Sigma Modulator comprises a first input 4A for receiving a first 1-bit signal and a second input 4B for receiving a second 1-bit signal. A quantizer Q quantises a p bit signal to 1-bit form, the requantized signal being the output signal of the processor. A plurality of signal combiners are provided. A first combiner (A1, 61, c1 b1, 71) forms the integral of the sum of the input signals and the output signal multiplied by coefficients A1, B1 and C1. At least one intermediate combiner forms the integral of the sum of the first and second input signals and the output signal multiplied by coefficients A2, B2, C2 together with the output of the first combiner. The final combiner a4, b4, 64 forms the integral of the sum of the first and second signals multiplied by coefficients A4 and B4 together with the output of the preceding intermediate combiner. The coefficients A and B applied to the first and second input signals define the proportions in which the first and second signals are combined. The coefficients A and B maybe variable, generated by a generator 42.

12 Claims, 2 Drawing Sheets

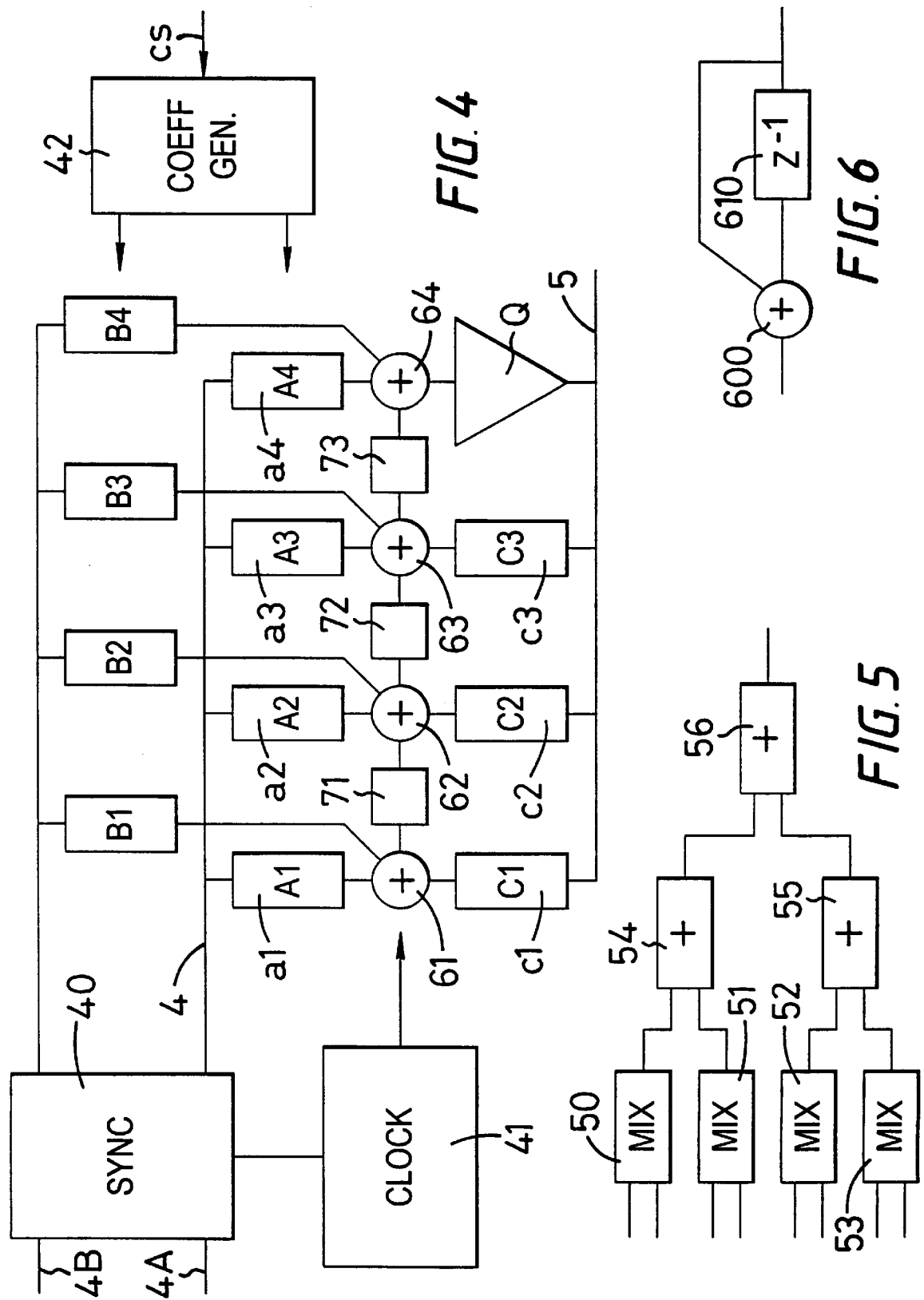

SIGNAL PROCESSORS

BACKGROUND OF THE INVENTION

1. Field of the Invention

The present invention relates to a 1-bit signal processor comprising an nth order Delta-Sigma Modulator where n is at least one. Preferred embodiments of the invention relate to processing audio signals but the invention is not limited to audio signal processors.

2. Description of the Prior Art

Background to the present invention will now be described by way of example with reference to FIGS. 1, 2 and 3 of the accompanying drawings of which FIG. 1 is a block diagram of a known Delta-Sigma Modulator, FIG. 2 is a block diagram of a previously proposed Delta-Sigma Modulator configured as an nth order filter section and FIG. 3 shows a noise shaping characteristic.

It is known to convert an analogue signal to a digital form by sampling the analogue signal at at least the Nyquist rate and encoding the amplitudes of the samples by an m bit number. Thus if m=8, the sample is said to be quantized to an accuracy of 8 bits. In general m can be any number of bits equal to or greater than 1.

For the purpose of quantizing to only 1 bit, it is known to provide an analogue to digital converter (ADC) known either as a "Sigma-Delta ADC" or as a "Delta-Sigma ADC". Herein the term "Delta-Sigma" is used. Such an ADC is described in for example "A Simple Approach to Digital Signal Processing" by Craig Marven and Gillian Ewers ISBN 0-904.047-00-8 published 1993 by Texas Instruments.

Referring to FIG. 1 in an example of such an ADC, the difference 1 (Delta) between an analogue input signal and the integral 2 (Sigma) of the 1-bit output signal is fed to a 1-bit quantizer 3. The output signal comprises bits of logical value 0 and 1 but representing actual values of −1 and +1 respectively. The integrator 2 accumulates the 1-bit outputs so that value stored in it tends to follow the value of the analog signal. The quantizer 3 increases (+1) or reduces (−1) the accumulated value by 1-bit as each bit is produced. The ADC requires a very high sampling rate to allow the production of an output bit stream the accumulated value of which follows the analogue signal.

The term "1-bit" signal as used in the following description and in the claims means a signal quantized to an accuracy of 1 digital bit such as is produced by a Delta-Sigma ADC.

A Delta-Sigma Modulator (DSM) configured as nth order filter section for directly processing a 1-bit signal was proposed by N. M. Casey and James A. S. Angus in a paper presented at 95th AES Convention Oct. 7–10, 1993 New York, USA entitled "One Bit Digital Processing of Audio Signals"—Signal Processing: Audio Research Group, The Electronics Department, The University of York, Heslington, York YO1 5DD England. FIG. 2 shows a 3rd order (n=3) version of such a DSM filter section.

Referring to FIG. 2, the DSM has an input 4 for a 1-bit audio signal and an output 5 at which a processed a 1-bit signal is produced. The bits of the 1-bit signal are clocked through the DSM by known clocking arrangements which are not shown. The output 1-bit signal is produced by a 1-bit quantizer Q which is for example a comparator having a threshold level of zero. The DSM has three stages each comprising a first 1-bit multiplier $a_1, a_2, a_3$ connected to the input 4, a second 1-bit multiplier $c_1, c_2, c_3$ connected to the output 5, an adder 61, 62, 63 and an integrator 71, 72, 73.

The 1-bit multipliers multiply the received 1-bit signal by p bit coefficients $A_1, A_2, A_3, C_1, C_2, C_3$ producing p bit products which are added by the adders 61, 62, 63 and the sums passed to the integrators 7. In the intermediate stages the adders $6_2, 6_3$ also sum the output of the integrator of the preceding stage. A final stage comprises another 1-bit multiplier $A_4$ connected to the input which multiplies the input signal by a p bit coefficient $A_4$ and an adder 64 which adds the product to the output of the integrator 73 of the preceding stage. The sum is passed to the quantizer Q.

Within the DSM, two's complement arithmetic is used to represent the positive and negative p bit numbers. The input to the quantizer Q may be positive, quantized at the output as +1 (logical 1) or negative quantized at the output as −1 (logical 0).

As observed by Casey and Angus "a one bit processor . . . will produce a one bit output that contains an audio signal that is obscured by noise to an unacceptable level and it is imperative the quantization noise is suitably shaped". The noise which obscures the audio signal is the quantization noise produced by the quantizer Q.

The quantizer Q may be modelled as an adder which has a first input receiving an audio signal and a second input receiving a random bit stream (the quantization noise) substantially uncorrelated with the audio signal. Modelled on that basis, the audio signal received at the input 4 is fed forward by multipliers $a_1, a_2, a_3, a_4$ to the output 5 and fed back by multipliers $c_1, c_2, c_3$ from the output 5. Thus coefficients A1 to A4 in the feed forward path define zeros of the Z-transform transfer function of the audio signal and coefficients C1–C3 in the feed back path define poles of the transfer function of the audio signal.

The noise signal, however is fed-back from the quantizer by the multipliers $C_1-C_3$ so that coefficients C1–C3 define poles of the transfer function of the noise signal. The transfer function of the noise signal is not the same as the transfer function of the input signal.

The coefficients A1 to A4 and C1 to C3 are chosen to provide circuit stability amongst other desired properties.

The coefficients C1–C3 are chosen to provide noise shaping so as to minimise quantization noise in the audio band, as shown for example in FIG. 3 by the full line 31.

The coefficients A1–A4 and C1–C3 are also chosen for a desired audio signal processing characteristic.

The coefficients A1–A4 and C1–C3 may be chosen by:

a) finding the Z-transform H(z) of the desired filter characteristic—e.g noise shaping function; and b) transforming H(z) to coefficients.

This may be done by the methods described in the paper "Theory and Practical Implementation of a Fifth Order Sigma-Delta A/D Converter, Journal of Audio Engineering Society, Volume 39, no. 7/8, 1991 July/August by R. W Adams et al."

and in the paper by Casey and Angus mentioned herein above using the knowledge of these skilled in the art. One way of calculating the coefficients is outlined in the accompanying Annex A.

The various papers mentioned herein above consider only nth order filter sections.

The present invention seeks to extend the use of nth order DSMs to other forms of signal processing, so that 1-bit signals may be used in such signal processing.

SUMMARY OF THE INVENTION

According to the present invention, there is provided a signal processor for 1-bit signals, comprising an nth order (where n is greater than or equal to 2) Delta Sigma Modulator having a first input for receiving a first 1-bit signal, a second input for receiving a second 1-bit signal, a quantizer for requantizing a p bit signal to 1-bit form the requantized signal being the output signal of the processor, a plurality of signal combiners including a first combiner for forming an integral of an additive combination of the product of the first signal and a first coefficient and of the product of the second signal and a second coefficient and of the product of the output signal and a third coefficient, at least one intermediate combiner for forming an integral of an additive combination of the product of the first signal and a first coefficient and of the product of the second signal and a second coefficient and of the product of the output signal and a third coefficient and of the integral of the preceding stage, and a final combiner for forming an additive combination of the product of the first signal and a first coefficient and of the product of the second signal and a second coefficient and of the integral of the preceding stage to form the said p bit signal which is requantized by the quantizer.

Thus there is provided a signal processor which combines the first and second signals. The said combiners operates on 1-bit signals and so coefficient multiplication is performed as 1-bit multiplication avoiding the need for p bit multipliers which are uneconomic.

Furthermore the DSM also provides noise shaping.

The said first and second coefficients applied to the first and second signals maybe fixed in which case the DSM acts as an adder which adds the first and second signals in fixed proportions defined by the said coefficients.

The said first and second coefficients applied to the first and second signals may be variable in which case the DSM acts as a mixer and/or fader.

The first and second coefficients define zeroes of the input signal transfer function and maybe fixed or variable, but the third coefficients define poles of the input signal transfer function and are fixed.

If the first and second signals applied to the DSM are produced by unsynchronized sources, synchronisation means are required so the bits of the signals are in phase synchronism at the DSM.

BRIEF DESCRIPTION OF THE DRAWINGS

The above and other objects, features and advantages of the invention will be apparent from the following detailed description of illustrative embodiments which is to be read in connection with the accompanying drawings, in which:

FIG. 4 is a schematic block diagram of a preferred signal combiner according to the present invention;

FIG. 5 is a schematic block diagram of a signal processing system in which the combiner of FIG. 4 maybe used;

FIG. 6 is a schematic block diagram of an integrator of the combiner of FIG. 4.

DESCRIPTION OF THE PREFERRED EMBODIMENTS

Figure 1:
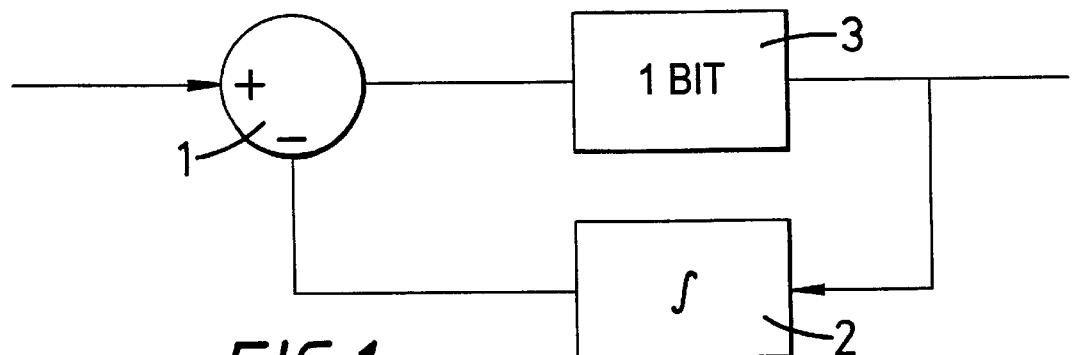
FIG. 1 is a block diagram of a conventional delta-sigma modulator.
Figure 2:
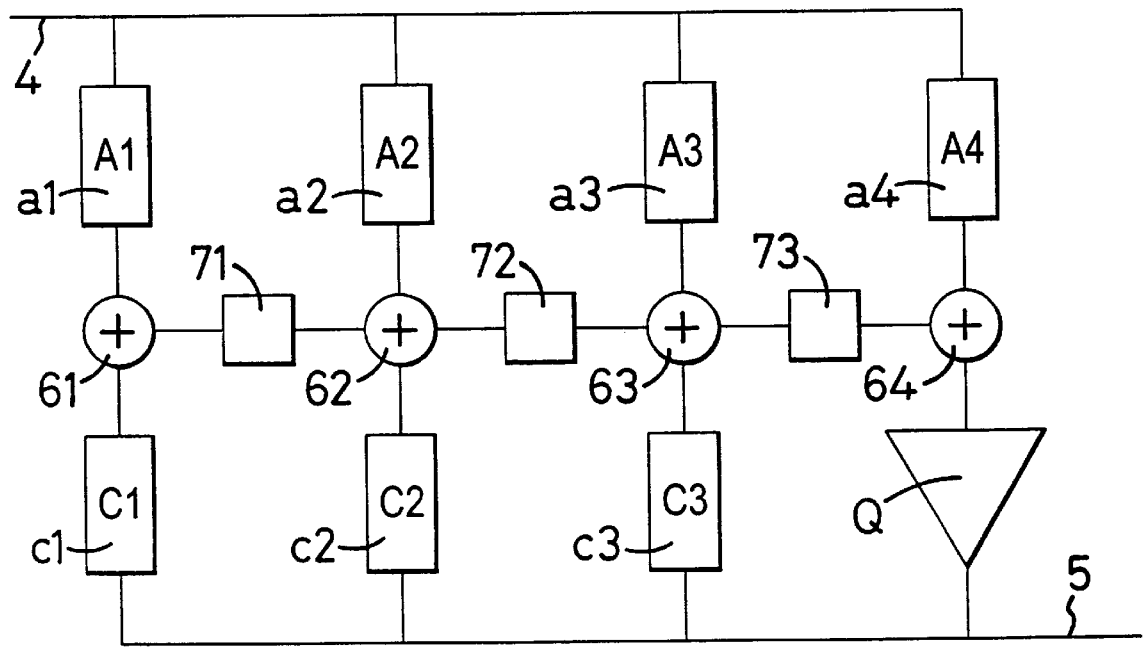
FIG. 2 is a block diagram showing a delta-sigma modulator configured as an nth order filter.
Figure 3:
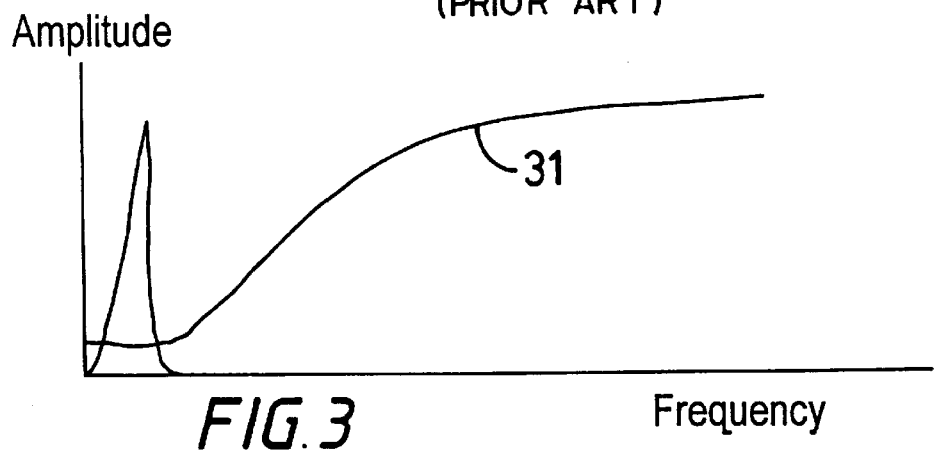
FIG. 3 shows a noise shaping characteristic diagram.

Referring to FIG. 4, the signal combiner comprises an nth order Delta-Sigma Modulator (DSM) where n is 2 or more. The example shown in a third order DSM (n=3) but n maybe greater than 3.

The order of the DSM is defined by the number of integrator sections. In the DSM of FIG. 4, and in accordance with the invention, each integrator section comprises: an adder 61, 62, 63 having three inputs; an output connected to an integrator 71, 72, 73; a first coefficient multiplier $a_1$, $a_2$, $a_3$ connected to a first input of the adder for multiplying a first 1-bit signal by a coefficient A1, A2, A3; a second coefficient multiplier $b_1$, $b_2$, $b_3$ connected to a second input of the adder for multiplying a second 1-bit signal by a coefficient B1, B2, B3; and a third coefficient multiplier C1, C2, C3 connected to a third input of the adder for multiplying the 1-bit output signal of the DSM by a third coefficient C1, C2, C3.

A final stage of the DSM comprises an adder 64 having three inputs connected to: a first coefficient multiplier $a_4$ for multiplying the first signal by a first coefficient A4; a second coefficient multiplier b4 for multiplying the first signal by a second coefficient B4; and the output of the integrator 73 of the preceding stage. The adder 64 has an output connected to a quantizer Q.

The adders 62, 63 of the intermediate stages each have a fourth input which receives the output of the integrator 71, 72 of the preceding stage.

The multipliers $a_1$ to $a_4$, $b_1$ to $b_4$ and $c_1$ to $C_4$ are all 1-bit multipliers, which multiply the 1-bit signals applied to them by p bit coefficients to produce p bit multiplicands.

The adders 61 to 64 and the integrators 71 to 73 operate on the p bit signals.

The p bit signals are represented in twos complement form for example whereby positive and negative numbers are represented.

The quantizer Q is a comparator having a threshold level of zero. Negative inputs to the quantizer are encoded as −1 (logic 0) and positive inputs as +1 (logical 1), to produce the 1-bit output at output 5.

The first and second 1-bit signals are applied to inputs 4A and 4B. A synchronisation circuit 40 is provided to synchronise the first and second signals to a local clock provided by a clock circuit 41. The synchronisation circuit may separately synchronize the two input signals to the local clock. Cl ock circuit 41 also controls the clocking of the DSM.

The coefficients A1 to A4, B1 to B4 and C1 to C3 are chosen using the methods described in the above mentioned papers to provide a) circuit stability; and b) noise shaping.

The coefficients C1 to C3 have fixed values to provide the noise shaping.

The coefficient A1 to A6 and B1 to B4 define zeros of the transfer function of the input signals and thus control the gain applied to the signals.

In accordance with one embodiment of the present invention, the coefficients A1 to A4 and B1 to B4 are chosen to sum the first and signals in fixed proportions defined by the coefficients. Thus coefficients A1 to A4 may be different from B1 to B4. The coefficients A1 to A4 may equal corresponding coefficients B1 to B4.

In accordance with another embodiment of the present invention, the coefficients A1 to A4 and B1 to B4 are variable to allow the first and second signals to be mixed in variable proportions. The variable coefficients A1 to A4, B1 to B4 are generated by a coefficient generator 42. Generator 42 maybe a coefficient store, storing sets of coefficients which are addressed by a variable addressing arrangement responsive to a control signal CS.

Alternatively the coefficients generator 42 maybe a micro computer which generates the coefficients in response to a control signal.

The DSM of FIG. 4 maybe used to process audio signals. Referring to FIG. 5, an audio signal mixer comprises two-input signal mixers 50 to 53 each of which is a DSM as shown in FIG. 4 with the variable coefficient generator 42. The outputs of pairs (50, 51 and 52, 53) of the mixers are fed to adders 54 and 55 which comprise DSMs as shown in FIG. 4 with fixed coefficients A1 to A4 and B1 to B4 . A final adder 56 is similar to adder 54 or 55.

When cascading DSMs in series as shown by way of example in FIG. 5, it may be necessary to provide inter-stage filters to prevent build up of noise which may affect the stability of the DSMs. The inter stage filters maybe provided in the manner described in co-filed UK application 9624674.9 (Attorney Reference I-96-16 P/1508.GB) (co-filed U.S. application Ser. No. 08/079,761 filed Nov. 26, 1997 incorporated herein by reference) or UK application 9624673.1 (Attorney reference I-96-25 P/1510.GB) (co-filed U.S. application Ser. No. 08/979,726 filed Nov. 26, 1997 incorporated herein by reference).

Where the coefficients A1 to A4, B1 to B4 and C1 to C4 are fixed, the combination of coefficient multipliers A1, B1, C1 and adders 61 in each stage of the DSM may be implemented by a look-up table stored in a ROM. For each coefficient A1, B1, C1 multiplied by a 1-bit signal there are only two results +A1, −A1, +B1, −B1 and +C1, −C1 . The various additive combinations of these results are stored in a ROM, which is then simply addressed by the 1-bit signals.

For variable coefficients the apparatus described in co-filed application 9624643.4 Attorney reference I-96-18 P/1529.GB may be used.

For completeness FIG. 6 shows an example of an integrator 71, 72 or 72. The integrator comprises an adder 600 and a delay element 610. The output of the delay element 610 is fed back to the adder to accumulate the integrator result. The adder 61, 62, 63 of each stage may also be used as the adder 600, except where a look-up table is used.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

CALCULATING COEFFICIENTS

This annex outlines a procedure for analysing a fifth order DSM and for calculating coefficients of a desired filter characteristic.

A fifth order DSM is shown in FIG. A having coefficients a to f and A to E, adders 6 and integrators 7. Integrators 7 each provide a unit delay. The outputs of the integrators are denoted from left to right s to w. The input to the DSM is a signal x[n] where [n] denotes a sample in a clocked sequence of samples. The input to the quantizer Q is denoted y[n] which is also the output signal of the DSM. The analysis is based on a model of operation which assumes quantizer Q is simply an adder which adds random noise to the processed signal. The quantizer is therefore ignored in this analysis.

The signal y[n]=fx[n]+w[n] i.e. output signal y[n] at sample [n] is the input signal x[n] multiplied by coefficient f plus the output w[n] of the preceding integrator 7.

Applying the same principles to each output signal of the integrators 7 results in Equations set 1.

$y[n]=fx[n]+w[n]$ $w[n]=w[n-1]+ex[n-1]+Ey[n-1]+v[n-1]$ $v[n]=v[n-1]+dx[n-1]+Dy[n-1]+u[n-1]$ $u[n]=u[n-1]+cx[n-1]+Cy[n-1]+t[n-1]$ $t[n]=t[n-1]+bx[n-1]+By[n-1]+s[n-1]$ $s[n]=s[n-1]+ax[n-1]+Ay[n-1]$

These equations are transformed into z-transform equations as well known in the art resulting in equations set 2.

$Y(z)=fX(z)+W(z)$ $W(z)(1-z^{-1})=z^{-1}(eX(z)+EY(z)+V(z))$ $V(z)(1-z^{-1})=z^{-1}(dX(z)+DY(z)+U(z))$ $U(z)(1-z^{-1})=z^{-1}(cX(z)+CY(z)+T(z))$ $T(z)(1-z^{-1})=z^{-1}(bX(z)+BY(z)+S(z))$ $S(z)(1-z^{-1})=z^{-1}(aX(z)+AY(z))$

The z transform equations can be solved to derive Y(z) as a single function of X(z) (Equation 3)

$$Y(z) = fX(z) + \frac{z^{-1}}{(1-z^{-1})}\left(eX(z) + EY(z) + \frac{z^{-1}}{1-z^{-1}}\left(dX(z) + DY(z) + \frac{z^{-1}}{1-z^{-1}}\left(cX(z) + CY(z) + \frac{z^{-1}}{1-z^{-1}}\left(bX(z) + BY(z) + \frac{z^{-1}}{1-z^{-1}}(aX(z) + AY(z))\right)\right)\right)\right)$$

This may be reexpressed as shown in the right hand side of the following equation, Equation 4. A desired transfer function of the DSM can be expressed in series form $$\frac{Y(z)}{X(z)}$$

given in left hand side of the following equation and equated with the right hand side in Equation 4.

$$\frac{Y(z)}{X(z)} = \frac{\alpha_0 + \alpha_1 z^{-1} + \alpha_2 z^{-2} + \alpha_3 z^{-3} + \alpha_4 z^{-4} + \alpha_5 z^{-5}}{\beta_0 + \beta_1 z^{-1} + \beta_2 z^{-2} + \beta_3 z^{-3} + \beta_4 z^{-4} + \beta_5 z^{-5}}$$

$$= \frac{f(1-z^{-1})^5 + z^{-1}e(1-z^{-1})^4 + z^{-2}d(1-z^{-1})^3 + z^{-3}c(1-z^{-1})^2 + z^{-4}b(1-z^{-1}) + z^{-5}a}{(1-z^{-1})^5 - z^{-1}E(1-z^{-1})^4 - z^{-2}D(1-x^{-1})^3 - z^{-3}C(1-z^{-1})^2 - z^{-4}B(1-z^{-1}) + Z^{-5}A}$$

Equation 4 can be solved to derive the coefficients f to a from the coefficients $\alpha_0$ to $\alpha_5$ and coefficients E to A from the coefficients ($\beta_0$ to $\beta_5$ as follows noting that the coefficients $\alpha_n$ and $\beta_n$ are chosen in known manner to provide a desired transfer function.

f is the only $z^0$ term in the numerator. Therefore $f=\alpha_0$.

The term $\alpha_0(1-z^{-1})^5$ is then subtracted from the left hand numerator resulting in $\alpha_0+\alpha_1 z^{-1} \ldots + \ldots \alpha_5 z^{-5} -\alpha_0(1-z^{-1})^5$ which is recalculated.

Similarly $f(1-z^{-1})^5$ is subtracted from the right hand numerator. Then e is the only $z^{-1}$ term and can be equated with the corresponding $\alpha_1$ in the recalculated left hand numerator.

The process is repeated for all the terms in the numerator.

The process is repeated for all the terms in the denominator.

We claim:

1. A signal processor for 1-bit signals, comprising an nth order (where n is greater than or equal to 1) Delta Sigma Modulator (DSM) having a first input for receiving a first 1-bit signal, a second input for receiving a second 1-bit signal, a quantizer for requantizing a p bit signal to 1-bit form the requantized signal being the output signal of the processor, a plurality of signal combiners including a first combiner for forming an integral of an additive combination of the product of the first signal and a first coefficient and of the product of the second signal and a second coefficient and of the product of the output signal and a third coefficient, at least one intermediate combiner for forming an integral of an additive combination of the product of the first signal and a first coefficient and of the product of the second signal and a second coefficient and of the product of the output signal and a third coefficient and of the integral of the preceding stage, and a final combiner for forming an additive combination of the product of the first signal and a first coefficient and of the product of the second signal and a second coefficient and of the integral of the preceding stage to form the said p bit signal which is requantized by the quantizer.

2. A signal processor according to claim 1, wherein the said first coefficients and the said second coefficients are chosen to combine the first and second signals in proportions defined by the first and second coefficients.

3. A signal processor according to claim 1, wherein the third coefficients are chosen to provide noise shaping.

4. A signal processor according to claim 1, wherein the first coefficients are variable.

5. A signal processor according to claim 1, wherein the second coefficients are variable.

6. A signal processor according to claim 1, further comprising means for generating the variable coefficients.

7. A signal processor according to claim 1, wherein the first and second coefficients are fixed.

8. A signal processor according to claim 1, where the first coefficients of the respective combiners are different.

9. A signal processor according to claim 1, wherein the second coefficients of the respective combiners are different.

10. A signal processor according to claim 7, wherein the combining means-comprises a look-up table.

11. A signal processor according to claim 1, comprising means for synchronising the bits of the first and second signals at the first and second inputs to a local clock which controls the clocking of the DSM.

12. An audio signal processor comprising a signal processing according to claim 1.

* * * * *

UNITED STATES PATENT AND TRADEMARK OFFICE
CERTIFICATE OF CORRECTION

PATENT NO.   :  6,078,621

DATED        :  June 20, 2000

INVENTOR(s)  :  Eastty et al.

It is certified that error appears in the above-identified patent and that said Letters Patent is hereby corrected as shown below:

Title page, item [75],
After Inventors' data, insert:

[73] Assignees:  Sony Corporation, Tokyo, Japan;
                 Sony United Kingdom Limited, Weybridge, England Signed and Sealed this Tenth Day of April, 2001

Attest:

NICHOLAS P. GODICI

Attesting Officer    Acting Director of the United States Patent and Trademark Office